(12) United States Patent
Kalyanam et al.

(10) Patent No.: US 10,860,051 B2
(45) Date of Patent: Dec. 8, 2020

(54) PROACTIVE CLOCK GATING SYSTEM TO MITIGATE SUPPLY VOLTAGE DROOPS

(71) Applicant: QUALCOMM Incorporated, San Diego, CA (US)

(72) Inventors: Vijay Kiran Kalyanam, Austin, TX (US); Eric Wayne Mahurin, Austin, TX (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 16/563,563

(22) Filed: Sep. 6, 2019

(65) Prior Publication Data

US 2020/0081479 A1    Mar. 12, 2020

Related U.S. Application Data

(60) Provisional application No. 62/728,972, filed on Sep. 10, 2018, provisional application No. 62/728,982, filed on Sep. 10, 2018, provisional application No. 62/728,990, filed on Sep. 10, 2018, provisional application No. 62/729,001, filed on Sep. 10, 2018.

(51) Int. Cl.
| | |
|---|---|
| G06F 1/08 | (2006.01) |
| H03C 3/09 | (2006.01) |
| H03L 7/08 | (2006.01) |
| H03L 7/07 | (2006.01) |
| H03K 19/00 | (2006.01) |

(52) U.S. Cl.
CPC ............ *G06F 1/08* (2013.01); *H03C 3/0966* (2013.01); *H03K 19/0016* (2013.01); *H03L 7/07* (2013.01); *H03L 7/0802* (2013.01)

(58) Field of Classification Search
CPC ......... G06F 1/08; H03K 19/0016; H03L 7/07; H03L 7/0802
USPC .................................................. 327/291–299
See application file for complete search history.

(56) References Cited

U.S. PATENT DOCUMENTS

| | | | |
|---|---|---|---|
| 9,413,344 B2* | 8/2016 | Bowman | H03K 5/13 |
| 9,628,089 B1* | 4/2017 | Jain | H03K 5/135 |
| 10,348,281 B1* | 7/2019 | Oliver | G06F 1/305 |
| 10,409,317 B2* | 9/2019 | Saint-Laurent | H03K 3/012 |
| 10,587,250 B2* | 3/2020 | Hanke | G06F 1/28 |
| 2003/0125922 A1 | 7/2003 | Grochowski et al. | |

(Continued)

OTHER PUBLICATIONS

International Search Report and Written Opinion—PCT/US2019/050118—ISA/EPO—Dec. 16, 2019.

*Primary Examiner* — Tomi Skibinski
(74) *Attorney, Agent, or Firm* — Moore IP

(57) ABSTRACT

A clock gating system (CGS) includes a digital power estimator configured to generate indications of a predicted energy consumption per cycle of a clock signal and a maximum energy consumption per cycle of the clock signal. The CGS further includes a voltage-clock gate (VCG) circuit coupled to the digital power estimator. The VCG circuit is configured to gate and un-gate the clock signal based on the indications prior to occurrence of a voltage droop event and using hardware voltage model circuitry of the VCG circuit. The VCG circuit is further configured to gate the clock signal based on an undershoot phase associated with the voltage droop event and to un-gate the clock signal based on an overshoot phase associated with the voltage droop event.

30 Claims, 11 Drawing Sheets

(56) References Cited

U.S. PATENT DOCUMENTS

2003/0126478 A1 7/2003 Burns et al.
2004/0119521 A1* 6/2004 Kurd ...................... H03L 7/091
327/291

* cited by examiner

PROACTIVE CLOCK GATING SYSTEM TO MITIGATE SUPPLY VOLTAGE DROOPS

I. CROSS-REFERENCE TO RELATED APPLICATIONS

The present application claims priority from U.S. Prov. Pat. App. No. 62/728,972, filed Sep. 10, 2018 and entitled "ELECTRONIC DEVICE AND METHOD TO ESTIMATE A VOLTAGE BASED ON EXPECTED CURRENT OR ENERGY CONSUMPTION," from U.S. Prov. Pat. App. No. 62/728,982, filed Sep. 10, 2018 and entitled "ELECTRONIC DEVICE AND METHOD TO SELECTIVELY GATE A CLOCK SIGNAL IN RESPONSE TO AN ESTIMATED VOLTAGE DROP," from U.S. Prov. Pat. App. No. 62/728,990, filed Sep. 10, 2018 and entitled "ELECTRONIC DEVICE AND METHOD TO INDICATE A COUNT OF GATED CLOCK CYCLES," and from U.S. Prov. Pat. App. No. 62/729,001, filed Sep. 10, 2018 and entitled "ELECTRONIC DEVICE AND METHOD TO SELECT VOLTAGE THRESHOLDS", each of which is incorporated herein by reference in its entirety.

II. FIELD

This disclosure is generally related to the field of supply voltage droop mitigation in processing systems. More specifically, some aspects are directed to proactive clock gating and dynamically reconfiguring activation thresholds to mitigate supply voltage droops.

III. DESCRIPTION OF RELATED ART

An electronic device may include a processor that executes instructions to perform operations. For example, an electronic device may include a vector processor that executes instructions to perform operations, such as modulation and demodulation, machine-learning, and image processing.

In some circumstances, a processor may be associated with a transition from a low-power state to a high-power state, resulting in a voltage "droop." For example, a vector processor may transition from a low-power state to a high-power state by executing a very-wide data vector instruction. Fast and large current transients (di/dt) in a power delivery network (PDN) result in supply voltage droops (voltage noise) that can degrade processor performance. In this case, power consumption by the processor may "spike" in response to execution of the very-wide data vector instruction, resulting in supply voltage droop. In other cases, the voltage droop is induced due to regular periodic and alternating transitions between low power and high power states, thus creating a resonating condition at the processing system and the PDN. The voltage droops reduce energy efficiency of the electronic device. In some cases, the reliability of operation of the electronic device is compromised due to incorrect operation.

Certain electronic devices use voltage guard bands to compensate for voltage droop. For example, a supply voltage may be increased to protect the supply voltage from falling below a particular value. Such a technique increases power consumption. Other electronic devices may perform other operations, such as by stalling a processor in response to detecting (or predicting) a voltage droop. However, this technique may not mitigate voltage droop due to clock timing margin (e.g., the inverse of clock frequency minus path delay) remaining the same. In another example, latency of activation of the mitigation technique impacts instruction scheduling at an electronic device, making the technique less effective.

Certain electronic devices use analog circuit or digital circuit-based voltage sensors or monitors to track supply voltage variations and use various mitigation mechanisms, such as frequency reduction or slowdown of processor execution, such as by introducing stall during processor execution. Such techniques are reactive in nature and are performed a few clock cycles after the voltage-droop has occurred. These techniques are less effective in reducing the voltage guard band of the system, since the voltage droop is already introduced in the PDN. In other implementations, voltage droop inducers (or "aggressors") may share voltage power supply rails with other processor components (e.g., "victims" of the voltage droop inducers), which may further degrade the guard band due to voltage rail sharing between the aggressor and victim processor entities. In some implementations, such circuit-based techniques are slow to transition the electronic device from a mitigation state to a full performance state of the electronic device.

Hence, there is a need for a solution that can mitigate voltage droops without loss in processor performance, while activating quickly and effectively reducing voltage degradation.

IV. SUMMARY

In a particular example, a clock gating system (CGS) includes a digital power estimator configured to generate indications of a predicted energy consumption per cycle of a clock signal and a maximum energy consumption per cycle of the clock signal. The CGS further includes a voltage-clock gate (VCG) circuit coupled to the digital power estimator. The VCG circuit is configured to gate and un-gate the clock signal based on the indications prior to occurrence of a voltage droop event and using hardware voltage model circuitry of the VCG circuit. The VCG circuit is further configured to gate the clock signal based on an undershoot phase associated with the voltage droop event and to un-gate the clock signal based on an overshoot phase associated with the voltage droop event.

In another particular example, a method includes receiving, at a voltage-clock gate (VCG) circuit from a digital power estimator, indications of a predicted energy consumption per cycle of a clock signal and a maximum energy consumption per cycle of the clock signal. The method further includes, in response to the indications, gating the clock signal. The clock signal is gated prior to occurrence of a voltage droop event and using hardware voltage model circuitry of the VCG circuit, and the clock signal is gated based on an undershoot phase associated with the voltage droop event. The method further includes un-gating the clock signal based on an overshoot phase associated with the voltage droop event.

In another particular example, a computer-readable medium stores instructions executable by a processor to initiate, perform, or control operations. The operations include receiving, at a voltage-clock gate (VCG) circuit from a digital power estimator, indications of a predicted energy consumption per cycle of a clock signal and a maximum energy consumption per cycle of the clock signal. The operations further include, in response to the indications, gating the clock signal. The clock signal is gated prior to occurrence of a voltage droop event and using hardware voltage model circuitry of the VCG circuit, and the clock signal is gated based on an undershoot phase associated with the voltage droop event. The operations further include un-gating the clock signal based on an overshoot phase associated with the voltage droop event.

In another particular example, an apparatus includes means for generating indications of a predicted energy consumption per cycle of a clock signal and a maximum energy consumption per cycle of the clock signal. The apparatus further includes means for gating and for un-gating the clock signal based on the indications and using hardware voltage model circuitry. The means for gating and un-gating is configured to gate the clock signal based on an undershoot phase associated with the voltage droop event and to un-gate the clock signal based on an overshoot phase associated with the voltage droop event.

One particular advantage provided by at least one of the disclosed embodiments is reduced latency or reduced power consumption associated with voltage droop mitigation. Another particular advantage provided by at least one of the disclosed embodiments is enhanced operation of devices of a shared power delivery network (PDN). Other aspects, advantages, and features of the present disclosure will become apparent after review of the entire application, including the following sections: Brief Description of the Drawings, Detailed Description, and the Claims.

V. BRIEF DESCRIPTION OF THE DRAWINGS

VI. DETAILED DESCRIPTION

Figure 1A:
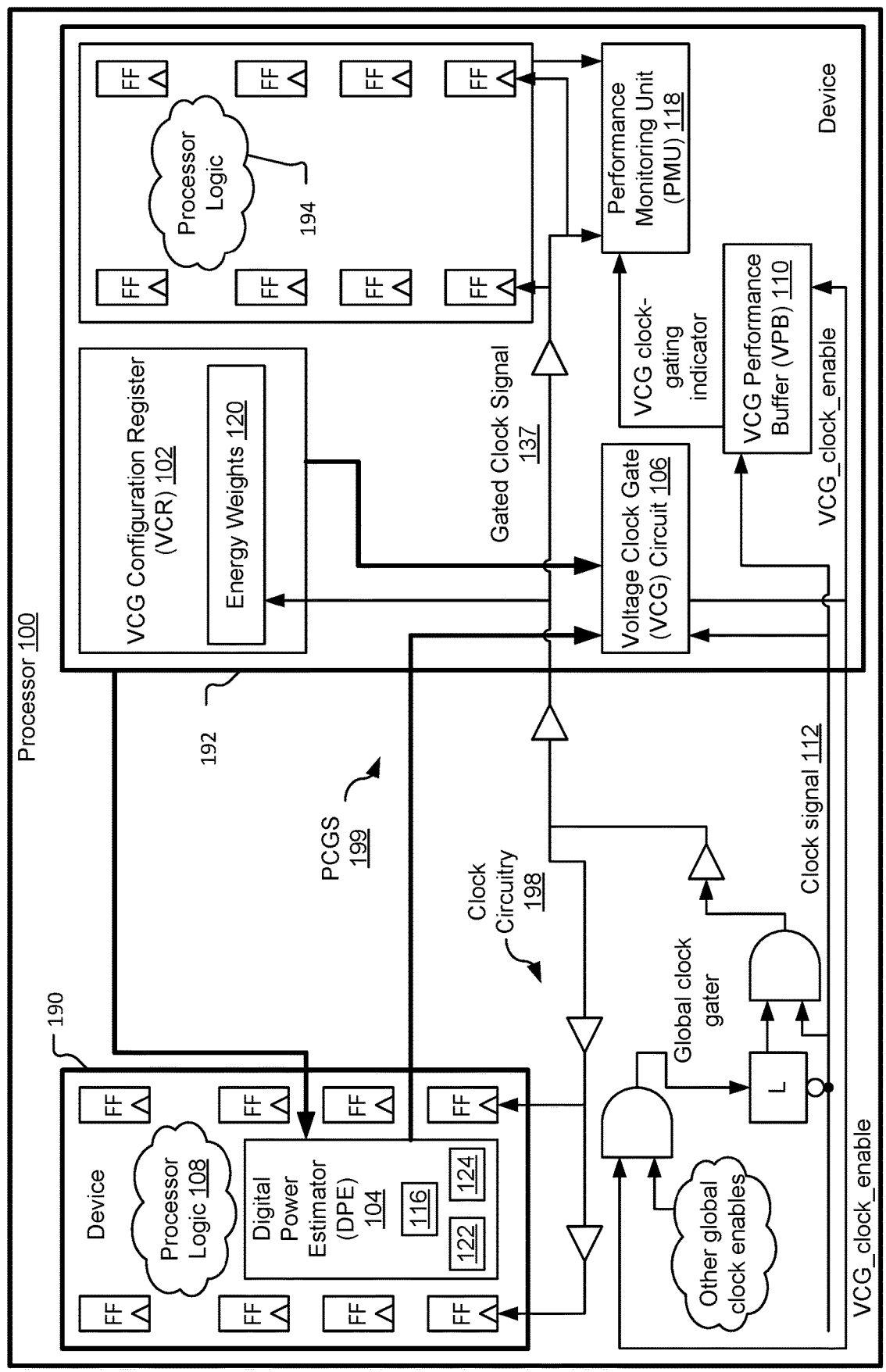
FIG. 1A is a diagram of a processor that includes a proactive clock-gating system (PCGS) containing a voltage-clock-gating (VCG) circuit, a digital power estimator (DPE), a VCG performance buffer (VPB), a performance monitoring unit (PMU), and a VCG configuration register (VCR).

A proactive clock gating system (PCGS) may include a voltage-clock gate (VCG) circuit configured to proactively perform supply voltage droop mitigation operations by gating and un-gating a clock domain. The VCG circuit may perform or initiate the voltage droop mitigation operations before occurrence of a voltage droop event and based on voltage estimation prediction performed using a hardware voltage model of the VCG circuit. The VCG circuit may clock gate a root clock signal (also referred to as a global clock signal) when a voltage droop is in an "undershoot" phase as predicted by the hardware voltage model. The VCG circuit may un-gate the root clock signal when in the voltage droop is in an "overshoot" phase.

In some examples, the PCGS tracks voltage droop without requiring system components (e.g., different devices and processors) to track a voltage level of the system components. Thus, in connection with operation of the PCGS, a device need not monitor its operational voltage when running at a specific programmed clock frequency either on a shared rail or on using a dedicated private rail (e.g., where each device receives an independent supply of voltage from a power delivery network (PDN)). In some examples, a VCG configuration register (VCR) is configured to store indications of one or more characteristics of the PDN, such as a center frequency and bandwidth of the PDN. The VCR may be configured to store indications of an energy weight used by the system, which may be sent through a digital power estimator (DPE) to the VCG circuit and used to predict voltage used by the system. In some examples, the center frequency and bandwidth are time invariant for the PDN.

In some aspects, the PCGS and the VCG circuit provide effective voltage droop mitigation in connection with a "shared" rail (e.g., where the PDN is shared by multiple homogeneous and heterogeneous devices). In some examples, the PCGS is integrated in a voltage droop inducing device (e.g., a processor or another device that may be referred to herein as an "aggressor"). The PCGS may suppress or mitigate voltage noise (e.g., a voltage droop event) at a source of the voltage noise by clock-gating before occurrence of the voltage droop event, thus preventing or reducing negative impact on the "victims" sharing the same rail as the aggressor.

In some examples, the VCG circuit includes event-per-cycle first-in, first-out (FIFO) retimed circuitry (EFRC) (e.g., as part of a front-end pipeline of the VCG circuit where the VCG circuit is coupled to a high frequency clocked processor). The EFRC may be configured to sample, hold, and release each power trace during clock gating and un-gating performed by the VCG circuit. A VCG clock enable signal may be provided to the VCG circuit and may be "timing critical" (and hence the retiming may be performed to gate a high frequency clock and to clock gate the EFRC). In some examples, the EFRC "freezes" certain values (e.g., energy and maximum energy per cycle transmission and other normalized values) that are used during operation by the VCG circuit.

In some examples, a voltage threshold multiplexer (VTM) selector is used to dynamically reconfigure a voltage droop mitigation threshold used by the hardware voltage model of the VCG circuit. The VCG circuit may trigger voltage droop mitigation in response to a predicted voltage droop exceeding the voltage droop mitigation threshold. In some examples, the VTM selector inhibits clock gating of consecutive clock cycles (e.g., so that a clock cycle following a gated clock cycle is ungated). The VTM may provide flexibility for a processing system to obtain improved performance at the cost of higher power by enabling a relaxed voltage threshold setting a cycle after a voltage droop violation (and after clock cycle gating by the VCG circuit). In a particular example, indications of the voltage threshold and the relaxed voltage thresholds are stored in the VCR.

In some implementations, one or more DPEs are used to provide the VCG circuit indications of a normalized energy per cycle and a maximum energy per cycle (e.g., where the energy is computed a few cycles ahead of certain processor execution operations associated with high power in a processor pipeline stage). The DPE may include of one or more weighted event indication generators configured to provide the VCG circuit with indications of predicted and maximum current or energy per cycle.

The VCG circuit may achieve zero-cycle latency in response to a voltage-droop event by predicting a future consumption of energy. Thus, clock gating can be performed to mitigate effects of voltage droop, which may improve performance as compared to systems that reactively address effects of voltage droop after occurrence of the voltage droop.

In some examples, the VCG circuit achieves the zero-cycle latency by predicting the future consumption of energy early enough to account for the difference between i) the number of pipeline stages from the DPE in a processor logic pipeline path to the execution of a high power voltage droop inducing stage and ii) the sum of the pipeline stages from the DPE to transmit the energy and maximum energy information to the VCG circuit and the number of VCG pipeline stages.

In some examples, the PCGS includes a VCG performance buffer (VPB) and gated clock count circuitry configured for performance measurement. In some examples, the VPB and the gated clock count circuitry are configured to measure system performance when a global clock of the system is clock-gated.

Referring to FIG. 1A, a processor is depicted and generally designated 100. The processor 100 is configured to perform clock gating to mitigate voltage droop.

The processor 100 includes multiple devices, such as a device 190 and a device 192. In some examples, the devices 190, 192 share a power supply source (e.g., a voltage rail). In some examples, one of the devices 190 corresponds to an "aggressor" device (e.g., a device that induces voltage droops), and the other of the devices 192 corresponds to a "victim" device (e.g., a device that suffers performance degradation as a result of voltage droops induced by the aggressor device).

FIG. 1A illustrates that the device 190 includes processor logic 108 and a digital power estimator (DPE) 104. FIG. 1A also illustrates that the device 192 includes processor logic 194, a voltage clock gate (VCG) circuit 106, a VCG configuration register (VCR) 102, a VCG performance buffer VPB 110, and a performance monitoring unit (PMU) 118. In some examples, the VCR 102, the DPE 104, the VCG circuit 106, the VPB 110, the PMU 118, and clock circuitry 198 are included in a clock gating system (CGS), such as a proactive clock-gating system (PCGS) 199. One or more components of the processor 100 may include one or more flip-flop (FF) circuits, as illustrated in the example of FIG. 1A.

In a particular example, the VCG circuit 106 is coupled to the VCR 102 and to the DPE 104. The DPE 104 is coupled to the VCR 102.

In one example, the VCG circuit 106 is coupled to the processor logic 108 and to the VPB 110. In some examples, the processor logic 108 and the VPB 110 are coupled to the PMU 118. In some implementations, the processor logic 108 includes digital signal processor (DSP) logic. In some implementations, the processor logic 108 includes a vector processor pipeline. In some implementations, the processor logic 108 includes a superscalar general-purpose processor pipeline or a very long instruction word (VLIW) processor.

In some implementations, the processor logic 108 includes a slave co-processor associated with a master processor (e.g., the processor logic 194). In some examples, the processor logic 194 includes superscalar processor logic, such as a superscalar processor pipeline.

In some examples, the VCG circuit 106 is configured to operate based on a zero latency voltage response loop and has a zero cycle response time. The VCG circuit 106 may be configured to gate a clock signal 112 (e.g., a "root" clock or "global" clock of the processor 100. In some examples, the clock signal 112 is generated using a phase locked loop (PLL), as an illustrative example. The VCG circuit 106 may be configured to gate the clock signal 112 to generate a gated clock signal 137. The VCG circuit 106 may be configured to gate an entire clock domain by gating the clock signal 112 (e.g., instead of controlling a single stall point, as performed by certain conventional devices).

In some examples, the DPE 104 is configured to detect events at the processor 100, such as a set of events 116. To illustrate, the set of events 116 may include processor pipeline events, memory access events, arithmetic events, one or more other events, or a combination thereof. One or more events of the set of events 116 may include an operation performed by the processor logic 108, an operation performed by the processor logic 194, or a combination thereof. The DPE 104 may be configured to detect (or search for) the set of events 116 during each cycle of the gated clock signal 137. In contrast to some stall-based voltage droop mitigation techniques, predicted current (or energy per cycle) may be computed by the DPE 104 and sent to the VCG circuit 106 earlier than a cycle causing the voltage-droop event.

The DPE 104 may be configured to estimate the energy consumption every clock cycle based on a weighted count of the set of events 116. The weighed count is based on a set of energy weights 120, where each energy weight is associated with a corresponding event type of the set of events 116. In some implementations, the VCR 102 is configured to store indications of the set of energy weights 120 and to output the indications of the set of energy weights 120 to the DPE 104. In some examples, the set of energy weights 120 is determined based on pre-silicon gate-level simulation or post-silicon characterization of benchmarks associated with the processor logic 108 and is scaled (or quantized) to fit a range (e.g., a bit length) of an output of the DPE 104.

For each cycle of the clock signal 112, the DPE 104 may output a first indication of a predicted energy 122 (e.g., a projection of actual energy consumption) associated with the cycle and a second indication of a maximum energy 124 (e.g., a projection of the maximum likely energy consumption) associated with the cycle. For example, the first indication may specify the predicted energy 122 that is to be used by the processor logic 108 during a particular cycle of the gated clock signal 137, and the second indication may specify the maximum energy 124 that is to be used by the processor logic 108 during the particular cycle. In a particular example, the DPE 104 is configured represent the first indication and the second indication using a plurality of bits, such as a string of nine bits, as an illustrative example.

In some examples, the DPE 104 is configured to determine one or more of the predicted energy 122 per cycle or the maximum energy 124 per cycle based on a weighted sum. In some examples, the weighted sum is based on counts of event types of the set of events 116 and is further based on the set of energy weights 120. For example, the DPE 104 may be configured to determine the predicted energy 122 per cycle as a summation of a count of event types per cycle multiplied by a corresponding energy weight (of the set of energy weights 120) for each event type. Alternatively or in addition, the DPE 104 may be configured to determine the maximum energy 124 per cycle by multiplying a maximum count per clock cycle for each event type (e.g., determined based on a theoretical maximum possible energy during processor execution, which may exclude certain events that cannot occur simultaneously in a particular cycle) with a corresponding energy weight of the event type. In a particular example, the DPE 104 is configured to provide indications of the predicted energy 122 per cycle and the maximum energy 124 per cycle to the VCG circuit 106.

Figure 1B:
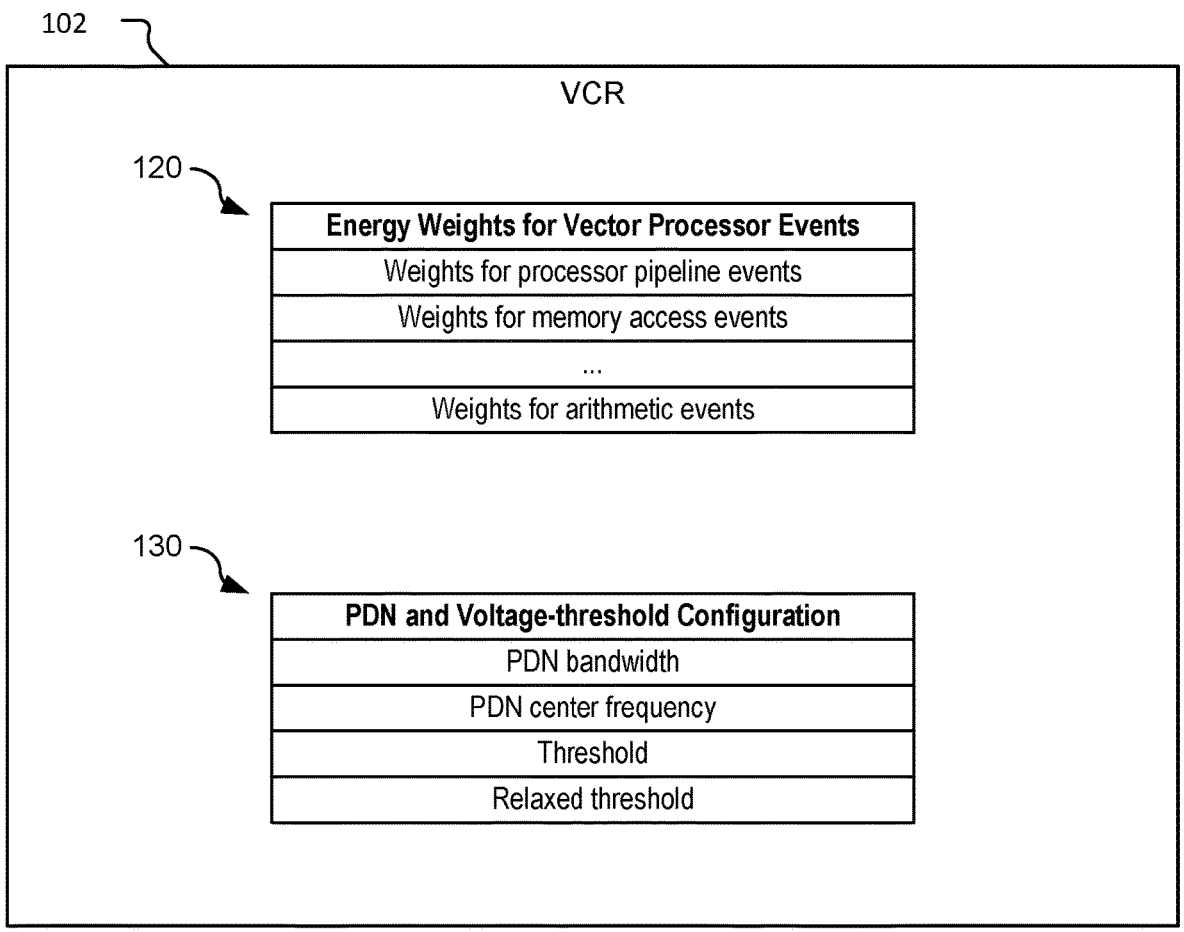
FIG. 1B illustrates certain examples of a set of energy weights used by the DPE and a set of other values, such as a voltage threshold and a relaxed threshold associated with the VCG circuit of FIG. 1A.

FIG. 1B illustrates certain examples of information that may be stored by the VCR 102. In FIG. 1B, the VCR 102 stores the set of energy weights 120 used by the DPE 104 to perform certain operations herein, such as estimation of the predicted energy 122 per cycle and the maximum energy 124 per cycle.

The VCR 102 can also store other values used to estimate voltage, such as values 130 illustrated in the example of FIG. 1B. For example, the values 130 include voltage thresholds, PDN information (e.g., configuration data associated with a PDN bandwidth and a PDN frequency), etc.

In some implementations, the VCR 102 includes two 32-bit memory mapped configuration registers storing indications of the set of energy weights 120 and characteristics associated with a PDN of the processor 100. The characteristics of the PDN may be configured using fields of the VCR 102. The PDN may be associated with a center frequency (CF) range, such as 48-600 megahertz (MHz), as an illustrative example. The PDN may be associated with a bandwidth (BW) range, such as a BW range of 6-300 MHz, as an illustrative example. The CF range and the BW range may be indicated in settings stored at the VCR 102. The CF range and the BW range may be tuned post silicon to match characteristics of the PDN. The PDN settings may be different based on particular device characteristics (e.g., package and board characteristics) and may be reconfigured after fabrication of a system-on-chip (SoC).

Figure 1C:
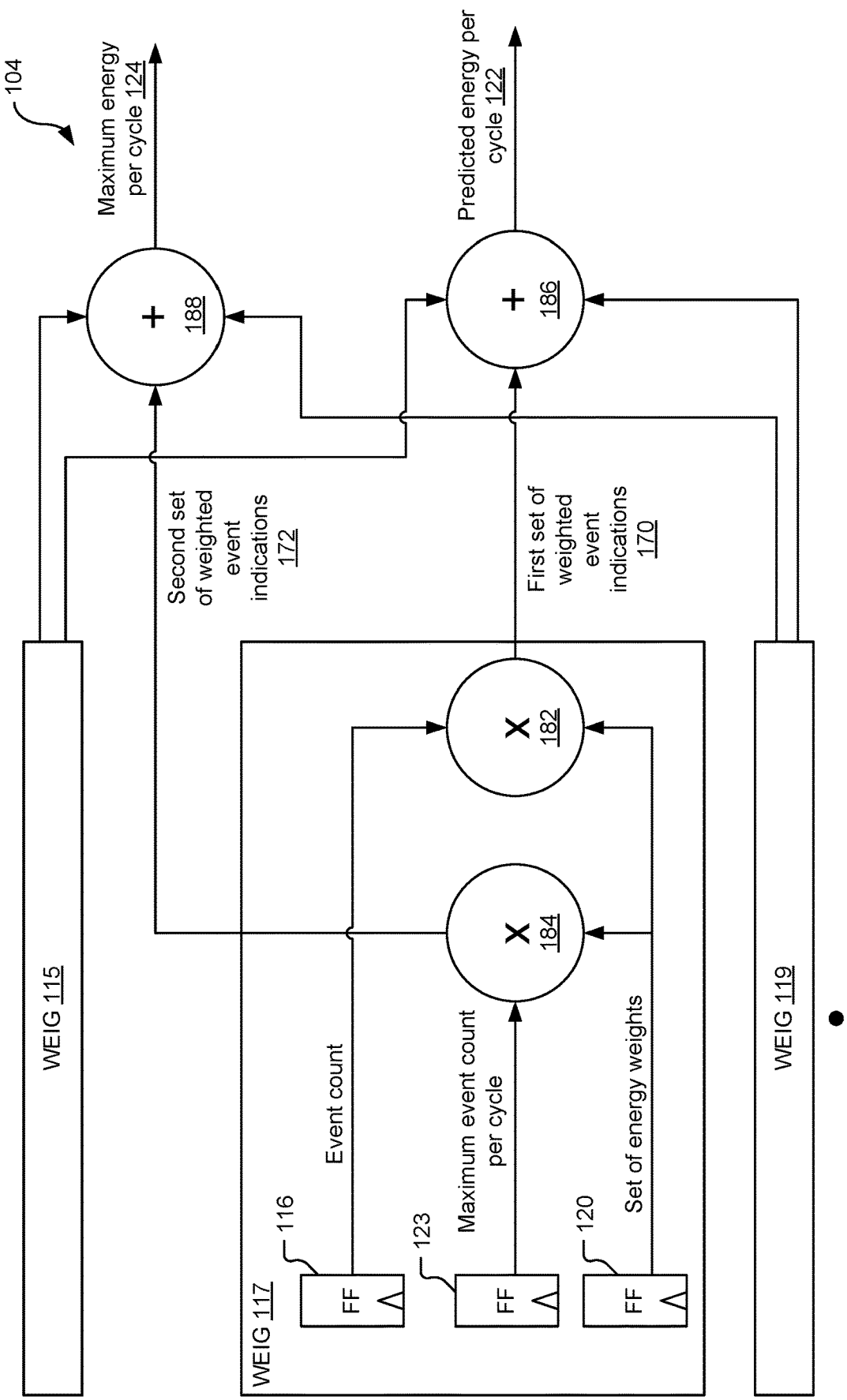
FIG. 1C illustrates an example of the DPE of FIG. 1A.

FIG. 1C is a diagram illustrating certain aspects of an example of the DPE 104 of FIG. 1A. The DPE 104 may include one or more weighted event indication generators (WEIGs), such as a representative WEIG 117. The example of FIG. 1C also depicts that the DPE 104 includes a WEIG 115 and a WEIG 119. In other implementations, the DPE 104 may include a different number of WEIGs.

The DPE 104 is configured to determine the predicted energy 122 per cycle and the maximum energy 124 per cycle. In the example of FIG. 1C, the WEIGs 115, 117, and 119 may each include one or more flip-flop (FF) circuits configured to store indications of the set of events 116, the set of energy weights 120, and a maximum event count per cycle 123.

In some examples, the set of events 116 includes microarchitecture events associated with the processor 100 of FIG. 1A. As illustrative examples, the set of events 116 may include one or more wide-data vector arithmetic events, one or more pipeline events, one or more memory operation events, one or more other events, or a combination thereof. The maximum event count per cycle 123 is the theoretical maximum possible event count per cycle during processor execution, which may exclude certain events that cannot occur simultaneously in a particular cycle.

In the example of FIG. 1C, the WEIG 117 includes a multiplication circuit 182 configured to multiply a count of the number of the set of events 116 per cycle by a corresponding weight of the set of energy weights 120 (e.g., a pipeline or flip-flop staged version of generated energy weights). In FIG. 1C, the WEIG 117 further includes a multiplication circuit 184 configured to multiply the maximum event count per cycle 123 of each event type of the set of events 116 by a corresponding weight of the set of energy weights 120.

In some examples, the set of energy weights 120 are based on pre-silicon simulation of the processor 100. For example, operation of the processor 100 can be simulated via a simulation program that tracks events at the processor 100 during simulation. Alternatively or in addition, in some examples, the set of energy weights 120 can be determined by tracking post-silicon operation of the processor 100 or another processor. In some implementations, the processor 100 corresponds to a processing system having a relatively predictable sequence of operations.

The WEIG 117 is configured to multiply (e.g., using the multiplication circuit 182) the count of each event type per cycle by a corresponding weight of the set of energy weights 120 to generate a first set of weighted event indications 170. The WEIG 117 is further configured to multiply (e.g., using the multiplication circuit 184) the maximum event count of each event type per cycle 123 by a corresponding weight of the set of energy weights 120 to generate a second set of weighted event indications 172. In the example of FIG. 1C, the DPE 104 includes a first addition circuit 186 configured to sum the first set of weighted event indications 170 from each WEIG (e.g., the WEIGs 115, 117, and 119) to determine the predicted energy 122 per cycle. FIG. 1C also depicts that the DPE 104 includes a second addition circuit 188 configured to sum the second set of weighted event indications 172 from each WEIG (e.g., the WEIGs 115, 117, and 119) to determine the maximum energy 124 per cycle.

One or more aspects of FIGS. 1A, 1B, and 1C improve device performance. For example, by determining and providing the predicted energy 122 per cycle and the maximum energy 124 per cycle to the VCG circuit 106, a voltage droop can be predicted and mitigated proactively. As a result, latency may be improved as compared to other devices that use digital critical timing path monitors and analog voltage sensors to trigger voltage droop mitigation.

Figure 2A:
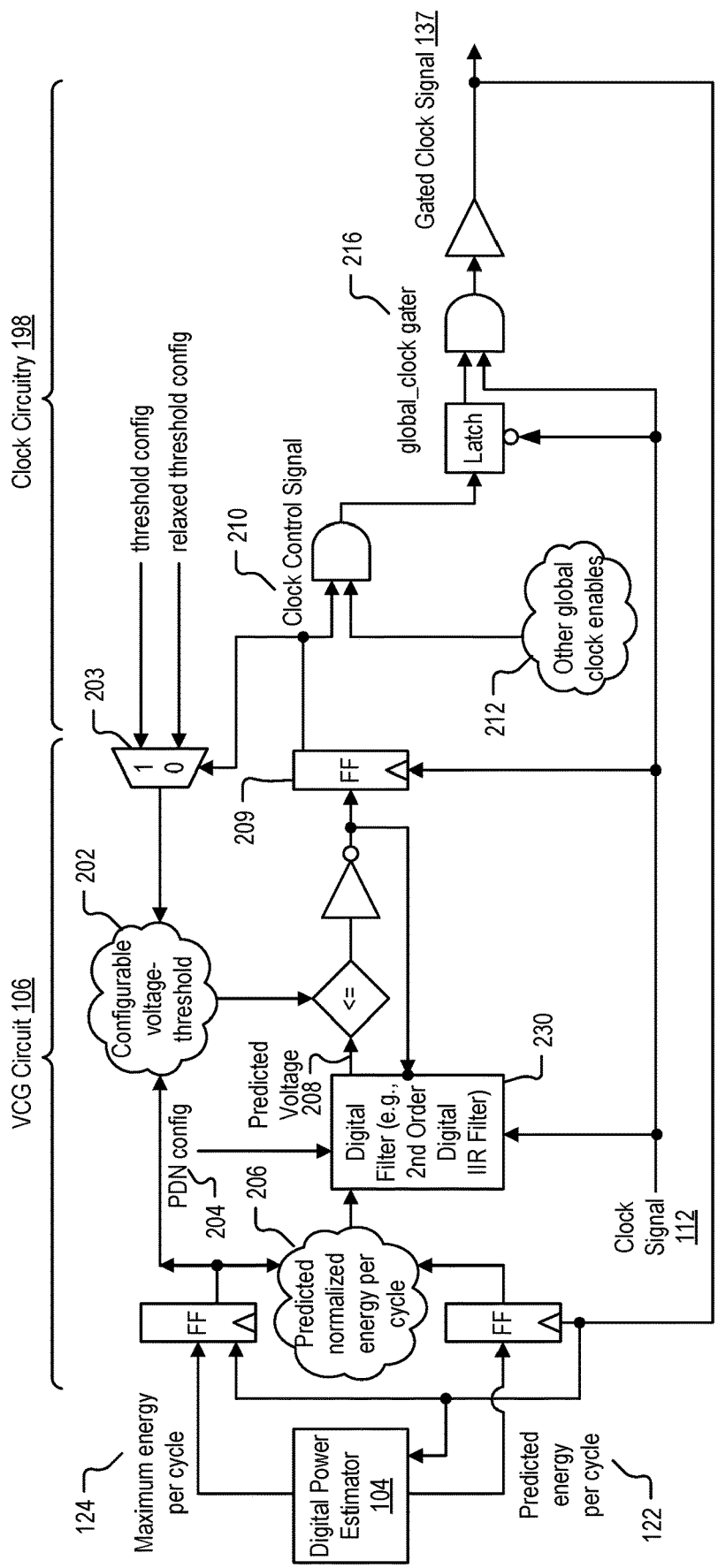
FIG. 2A is a schematic diagram illustrating an example of the VCG circuit of FIG. 1A.

FIG. 2A depicts certain illustrative aspects of examples of the DPE 104, the VCG circuit 106, and the clock circuitry 198. In FIG. 2A, the VCG circuit 106 is coupled to the DPE 104 and to the clock circuitry 198. For example, in FIG. 2A, the VCG circuit 106 includes one or more input flip-flops coupled to the DPE 104 and further includes one or more output flip-flops (e.g., a flip-flop 209) coupled to the clock circuitry 198.

In the example of FIG. 2A, the VCG circuit 106 has a hardware voltage model enabled by a digital filter 230, such as a digital band-pass second order infinite impulse response (IIR) filter. Alternatively or in addition, the hardware voltage model of the VCG circuit 106 may be implemented in a variety of devices and circuits for sensing voltage dynamically, and is not limited to the particular implementation of FIG. 2A.

In some examples, for each cycle of the clock signal 112, the VCG circuit 106 provides an indication of a clock control signal 210 to a global clock gater 216. In some examples, the VCG circuit 106 performs global clock gating and un-gating based on a voltage-prediction decision generated by the VCG circuit 106. In some aspects, operation of the VCG circuit 106 has certain benefits over conventional techniques, such as stall-based voltage droop mitigation. For example, conventional voltage droop mitigation techniques may be unable to introduce stall during VLIW instruction packet execution and may be ineffective for processors executing instructions that are issued and executed over multiple cycles. As another example, conventional voltage droop mitigation techniques may wait to mitigate voltage droop over a few cycles (e.g., 4 cycles) before stalling. As an additional example, clock gating by the VCG circuit 106 may preserve a relationship within and across instruction packets executed by the processor 100. As a further example, use of the VCG circuit 106 may reduce or eliminate scheduler dependencies encountered in stall-based techniques and may not involve changing instruction scheduling. As another example, use of the VCG circuit 106 may provide more power (due to voltage droop reduction effectiveness) benefit compared to stall-based techniques.

In some implementations, the VCG circuit 106 is configured to proactively mitigate voltage droop by gating the clock signal 112 in response to determining that a voltage-response is predicted to be equal to or less than a value of a configurable voltage threshold 202. In some examples, the configurable voltage threshold 202 is received from a voltage threshold multiplexer (VTM) selector circuit 203. In some examples, the VCG circuit 106 clock gates the clock signal 112 when a voltage droop is in an undershoot phase as predicted by the hardware voltage model. The VCG circuit 106 may be configured to un-gate the clock signal 112 when the voltage droop is in an overshoot phase.

The VCG circuit 106 may be configured to determine the configurable voltage threshold 202 using an indication of the maximum energy 124 per cycle in combination with PDN configuration settings 204 retrieved from the VCR 102. The VCG circuit 106 may be configured to determine, based on the predicted energy 122, a normalized predicted energy 206 per cycle and to use the normalized predicted energy 206 per cycle and the PDN configuration settings 204 to determine a predicted voltage-response 208.

When the predicted voltage-response 208 is equal or less than the configurable voltage threshold 202, the clock control signal 210 is combined with one or more global clock enables 212 to generate the gated clock signal 137 through the global clock gater 216. Thus, in some examples, the clock control signal 210 enables clock-gating of the processor 100 of FIG. 1A in response to an estimated voltage droop event that is predicted to occur. The VCG circuit 106 may be configured to un-gate the processor 100 in response to detecting an overshoot phase associated with a particular voltage margin, thus avoiding a voltage-droop event during an un-gating event. In some cases, techniques in accordance with FIG. 2A improve performance of the system as a whole due to quick reaction time of engaging and disengaging voltage droop mitigation as compared to other devices that use digital and analog circuit monitors to trigger droop mitigation.

Figure 2B:
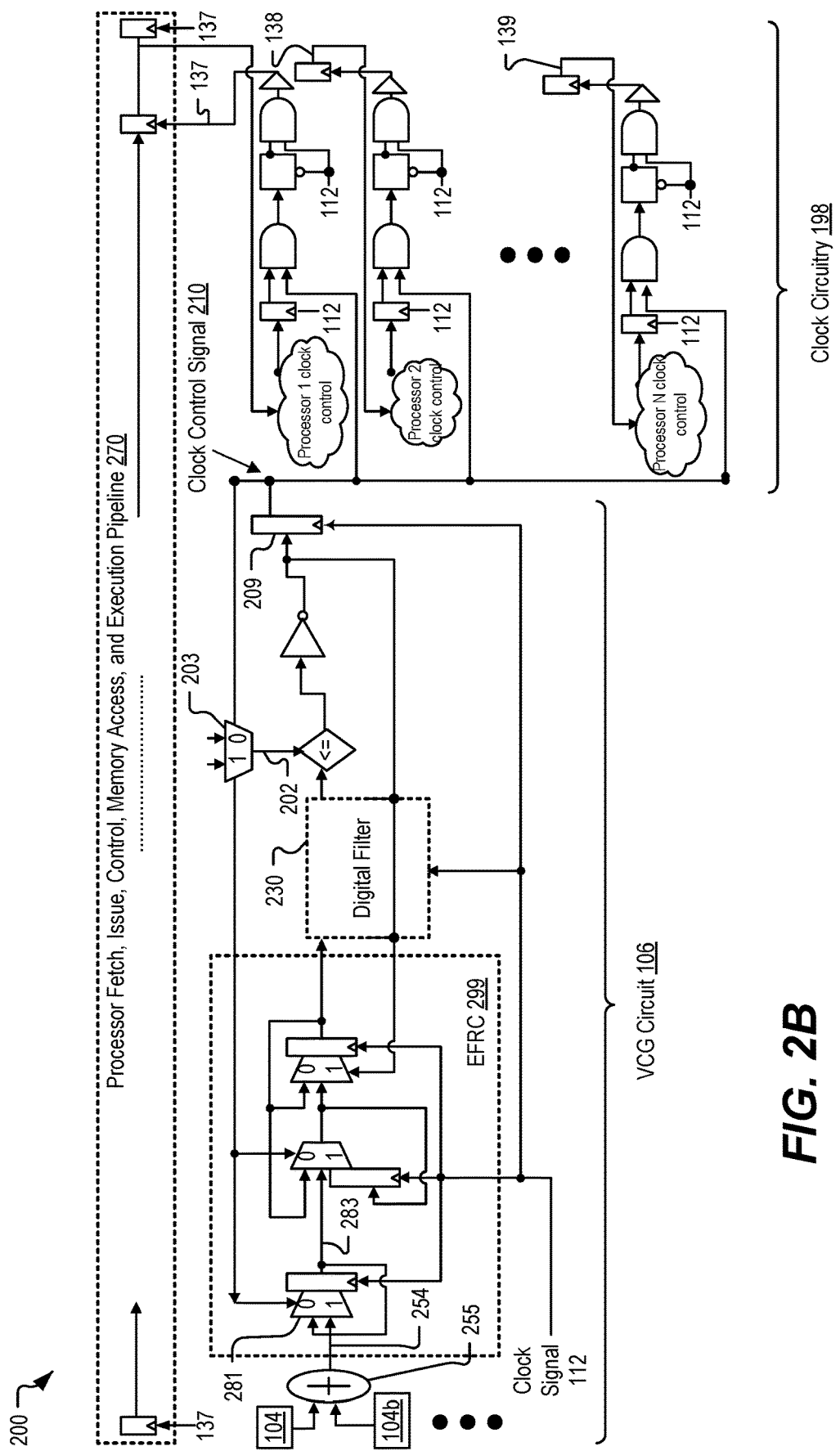
FIG. 2B is a diagram illustrating aspects of event-per-cycle first-in, first-out (FIFO) retimed circuitry (EFRC) that may be included in the VCG circuit of FIG. 1A.

FIG. 2B depicts an illustrative example of a device 200 that is included in the processor 100 of FIG. 1A. The device 200 includes a processor fetch, issue, control, memory access, and execution pipeline 270 (e.g., a processor pipeline of the processor 100), the VCG circuit 106, and the clock circuitry 198.

In FIG. 2B, the VCG circuit 106 includes event-per-cycle (FIFO) retimed circuitry (EFRC) 299. In some examples, the EFRC 299 is included in a front-end pipeline of the VCG circuit 106 that is coupled to one or more DPEs, such as the DPE 104.

In FIG. 2B, the VCG circuit 106 is configured to generate or receive a digital signal 254 indicative of expected energy to be consumed by an electronic device (e.g., the processor 100) during a time period (e.g., during a particular cycle of the clock signal 112). For example, the digital signal 254 may be generated by or provided from the DPE 104.

In some implementations, multiple DPEs (e.g., the DPE 104 and a DPE 104b) are coupled to an adder 255 of the device 200, and a sum of indications of energy per cycle from the multiple DPEs may be computed by the adder 255 to generate the digital signal 254 representing current per cycle as estimated by the multiple DPEs. The digital signal 254 hence may indicate one or more of the predicted energy 122 or the maximum energy 124 as estimated by more than more than one DPE.

The VCG circuit 106 is configured to generate the clock control signal 210 in response to an estimated voltage drop of the electronic device exceeding the configurable voltage threshold 202 during the time period.

The device 200 further includes the clock circuitry 198 coupled to an output of the VCG circuit 106. The clock circuitry 198 is configured to receive the clock signal 112 and to selectively gate the clock signal 112 responsive to the clock control signal 210, generating the gated clock signal 137.

The EFRC 299 may be configured to sample, hold, and release predicted energy and maximum energy values during a clock gating operation performed by the VCG circuit 106. To illustrate, in some implementations, the EFRC 299 is configured to store first values corresponding to energy per cycle consumption associated with scheduled instructions or scheduled packets of the electronic device. The energy per cycle may be determined based on the set of energy weights 120. The EFRC 299 may be configured to store second values based on the clock control signal 210. In a particular example, the EFRC 299 may also store other transformed and other normalized values generated based on the set of energy weights 120 and the values 130 in FIG. 1B (e.g., one or more threshold configuration settings, a center frequency configuration setting, a bandwidth configuration setting, one or more other settings, or a combination thereof).

During operation, the device 200 may receive, at the VCG circuit 106, the digital signal 254. The digital signal 254 is indicative of expected energy (e.g., one or more of the predicted energy 122 per cycle or the maximum energy 124 per cycle) to be consumed by an electronic device during a time period. The device 200 may be configured to generate, based on the expected energy per cycle, the clock control signal 210 in response to an estimated voltage drop of the electronic device exceeding the configurable voltage threshold 202 during the time period. The device 200 may be configured to selectively gate the clock signal 112 using the clock circuitry 198 responsive to the clock control signal 210.

In some examples, the EFRC 299 includes FIFO storage circuitry, which may be implemented using retiming logic to ensure cycle accuracy of the clock control signal 210. In some examples, the EFRC 299 is configured to receive (e.g., via the digital signal 254) and hold (e.g., "freeze") values of energy per cycle, maximum energy per cycle, and computed values of PDN configurations that are to be sent to the digital filter 230.

The EFRC 299 may include data and control buses each having a bus width of one or more bits. Data from the buses may propagate through one or more multiplexers of the EFRC 299 (e.g., a representative multiplexer 281) based on the value of the clock control signal 210. In a particular example, the clock control signal 210 is provided to each of the multiplexers as a select signal. A logic one value of the clock control signal 210 may cause the multiplexer 281 to output a digital signal 283.

Each of the multiplexers may be configured to receive an output signal as a feedback input signal, such as by receiving the output signal 283 at a first input of the multiplexer 281. The multiplexer 281 may be configured to receive digital signal 283, and other multiplexers of the EFRC 299 may be configured to receive an output of the previous multiplexer as an input. One or more multiplexer outputs may be stored at flip-flop circuits of the EFRC 299, such as illustrated in the example of FIG. 2B.

In FIG. 2B, multiple gated clock signals 137 may be generated by the clock circuitry 198 for each of a plurality of N processors (where N indicates a positive integer greater than one). In some examples, a first gated clock signal 137 is provided to a first processor (e.g., to the processor fetch, issue, control, memory access, and execution pipeline 270), a second gated clock signal 138 is provided to a second processor, and a third gated clock signal 139 is provided to the Nth processor.

By using one or more aspects of FIG. 2B, voltage droop can be predicted rather than reactively detected. As a result, overall performance may be enhanced, voltage may be reduced, or a combination thereof.

Figure 3A:
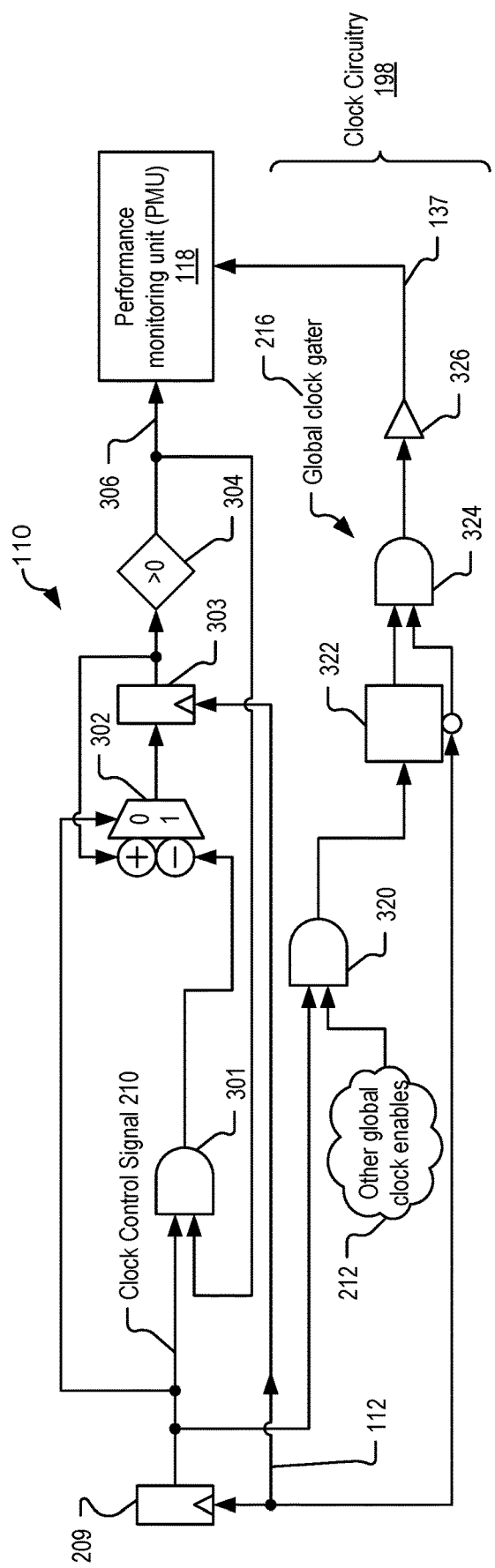
FIG. 3A is a diagram illustrating aspects of the VPB of FIG. 1A, which may be used to measure a number of VCG clock gating cycles.

FIG. 3A depicts certain aspects of an example of the VCG performance buffer (VPB) 110. The VPB 110 is coupled to the VCG circuit 106, such as via the flip-flop 209 of the VCG circuit 106. The VPB 110 is also coupled to the PMU 118 and to the clock circuitry 198.

The VPB 110 may be configured to count gated clock cycles for performance measurement. The VPB 110 may be configured to measure performance when the global clock of the system (e.g., the clock signal 112) is clock-gated.

In the example of FIG. 3A, the VPB 110 includes a gate 301 (e.g., an AND gate), a counter 302 (e.g., an increment and decrement counter), a sequential buffer 303, and a comparison circuit 304.

The counter 302 may be configured to increment in response to the clock signal 112. In some implementations, the processor logic 108 is deactivated in response to gating of the clock signal 112 by the VCG circuit 106. Upon disengagement by the VCG circuit 106 and restarting of the gated clock signal 137, the VPB 110 may be configured to begin decrementing the counter 302 and to transmit an enable signal (e.g., a 1-bit indicator) to the PMU 118 to cause the PMU 118 to begin counting cycles of the clock signal 112.

In some examples, the global clock gater 216 is responsive to the one or more other global clock enables 212. In a particular example, the global clock gater 216 is configured to generate, based on the clock signal 112 and the one or more other global clock enables 212, the gated clock signal 137.

The sequential buffer 303 is configured to store an accumulated count of gated clock cycles of the gated clock signal 137. The comparison circuit 304 is coupled to an output of the sequential buffer 303 and is configured to generate an output signal 306 indicative of whether the accumulated count exceeds zero.

The gate 301 is configured to receive the clock control signal 210 and the output signal 306. The counter 302 is configured to selectively increment or decrement the accumulated count based on an output of the gate 301 and based on an output of the sequential buffer 303. In a particular example, when the clock control signal 210 indicates no clock gating, the accumulated count is decremented by one, and when the clock control signal 210 indicates clock gating, the accumulated count is incremented by one. In a particular example, decrementing of the accumulated count is disabled when the output signal 306 indicates that the accumulated count is zero or when the clock control signal 210 indicates clock gating.

Thus, in some examples, the counter 302 is configured to increment the accumulated count while the clock control signal 210 indicates clock gating. The counter 302 may be configured to decrement the accumulated count, until the accumulated count equals zero, while the clock control signal 210 does not indicate clock gating.

The global clock gater 216 is configured to generate the gated clock signal 137 based on selectively gating cycles of the clock signal 112 responsive to the clock control signal 210 and to the one or more global clock enables 212. In the example of FIG. 3A, the global clock gater 216 includes a gate 320 (e.g., an AND gate) configured to receive the one or more global clock enables 212 and the clock control signal 210. A latch 322 is coupled to receive an output signal from the gate 320. A gate 324 (e.g., an AND gate) is configured to selectively pass or gate the clock signal 112 based on an output of the latch 322. The latch 322 and the sequential buffer 303 are clocked by the clock signal 112. In the example of FIG. 3A, the global clock gater 216 includes a buffer 326 configured to buffer an output of the gate 324 to generate the gated clock signal 137.

In some implementations, the PMU 118 is coupled to an output of the clock circuitry 198. The performance monitoring unit 118 monitors performance of a processor (e.g., the processor 100). The performance monitoring unit 118 and the processor 100 are responsive to the gated clock signal 137. Processor cycles and processor performance events in PMU 118 are used to calculate performance statistics. However, if the clocks to the PMU 118 are gated due to an indicator, the PMU counts cannot account for cycles clocks are being gated (e.g., due to voltage droop mitigation). In an example, the performance monitoring unit 118 is in a clock domain of the clock signal 112 and, when the clock signal 112 is gated to mitigate voltage droop at the processor 100, the performance monitoring unit 118 (which is sampling on the gated clock signal 137) does not detect one or more cycles of the clock signal 112.

The counter 302 may be configured to count a number of gated clock cycles. The comparison circuit 304 may be configured to provide an output signal 306 (e.g., a 1-bit signal) to the PMU 118 indicating the number of gated clock cycles.

The PMU 118 is responsive to the output signal 306 of the comparison circuit 304 to determine a number of cycles of the clock signal 112 that have elapsed while the clock signal 112 is gated. To illustrate, the PMU 118 is configured to determine a number of gated clock cycles during which the output signal 306 indicates that the accumulated count exceeds zero. The PMU 118 is configured to adjust a performance measurement of the processor at least partially based on the number of gated clock cycles during which the output signal 306 indicates that the accumulated count exceeds zero.

Operation of the VPB 110 is described in accordance with a particular implementation in which a PMU event is used to calculate the number of clock cycles of the clock signal 112 that are clock-gated by a voltage-droop mitigation mechanism (e.g., the VCG circuit 106) that generates the clock control signal 210. In one example, the VCG circuit 106 generates the gated clock signal 137 by gating the root clock (e.g., the clock signal 112) of the master processor and a vector coprocessor including the PMU 118. The count of gated clock cycles in the sequential buffer 303 is reset on boot-up. When the VCG circuit 106 engages due to a voltage droop event (e.g., the clock control signal 210 indicates voltage clock gating, or that the clock is disabled), the gated clock signal 137 is generated, and the counter 302 is incremented.

When the count is greater than 0, the comparison circuit 304 asserts the output signal 306 indicating that clock gating is engaged. During this time, the PMU 118 cannot sample this indicator because the gated clock signal 137 used for sampling by the PMU 118 is off. After the clock gating disengages (e.g., the clock control signal 210 does not indicate clock gating, or that the clock is enabled), the clock signal 112 is no longer gated, and the VPB 110 starts decrementing the counter 302 responsive to the un-gated tap of the clock signal 112. Concurrently, the PMU 118 starts sampling the output signal 306 indicator of a non-zero accumulated count responsive to the clock signal 112, which is also now un-gated. The output signal 306 indicator of a non-zero accumulated count remains high until the decremented value in the sequential buffer 303 reaches zero. Because the number of cycles during processor execution when the processor remains un-gated (i.e., no clock gating due to clock control signal 210 having a value of "1") is greater than the number of gated clock cycles (i.e., clock gating due to clock control signal 210 having a value of "0"), the accumulated count does not overflow the sequential buffer 303.

By generating the output signal 306 to indicate a number of gated clock cycles, the PMU 118 can adjust performance monitoring to account for such gated clock cycles. As a result, performance may be monitored with increased accuracy.

Figure 3B:
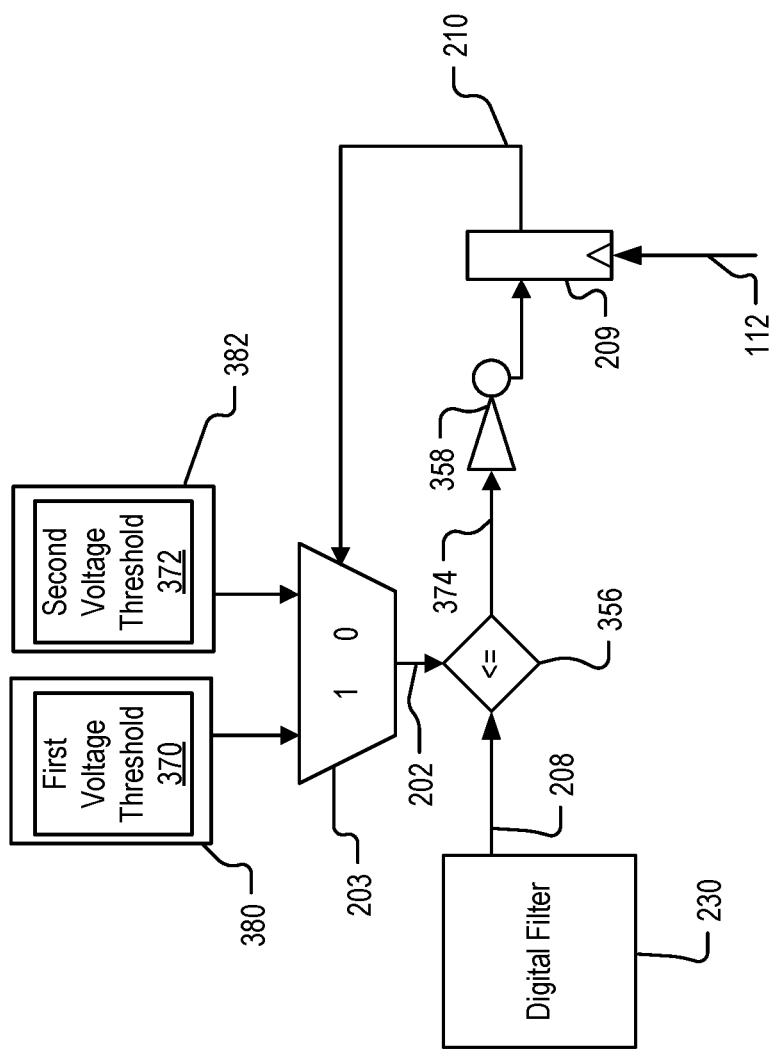
FIG. 3B is a diagram illustrating aspects a voltage threshold multiplexer (VTM) selector that may be used inside the VCG circuit of FIG. 1A to determine or modify a voltage violation threshold for clock gating.

FIG. 3B depicts an illustrative example of components that may be included in the VCG circuit 106. The components illustrated in FIG. 3B include the VTM selector circuit 203 and the digital filter 230.

In some examples, the VTM selector circuit 203 is configured to select among multiple different voltage thresholds, such as a first voltage threshold 370 and a second voltage threshold 372. The VTM selector circuit 203 may dynamically select, during operation of the processor 100 and based on the first voltage threshold 370 and the second voltage threshold 372, between performance improvement at the cost of increased power and power savings at the cost of reduced performance. In some examples, the first voltage threshold 370 corresponds to "threshold config" illustrated in FIG. 2A, and the second voltage threshold 372 corresponds to "relaxed threshold config" illustrated in FIG. 2A.

The VTM selector circuit 203 and the digital filter 230 are coupled to inputs of a comparison circuit 356. A logic circuit 358 is coupled to the comparison circuit 356 and to the flip-flop 209.

The VTM selector circuit 203 is responsive to the clock control signal 210 to selectively output the first voltage threshold 370 or the second voltage threshold 372 as the configurable voltage threshold 202 to the comparison circuit 356. As a result, a criterion used to determine whether clock gating by the VCG circuit 106 is to be performed for a particular clock cycle can be adjusted based on whether clock gating is performed following an immediately preceding gated clock cycle. This reduces or eliminates a likelihood that clock gating is performed for two consecutive clock cycles.

A first buffer 380 is coupled to a first input of the VTM selector circuit 203 and is configured to store the first voltage threshold 370. A second buffer 382 is coupled to a second input of the VTM selector circuit 203 and is configured to store the second voltage threshold 372. The buffers 380, 382 may correspond to registers, such as the VCR 102, and may store the first voltage threshold 370 and the second voltage threshold 372 in the values 130, as shown in FIG. 1B.

The VTM selector circuit 203 is configured to select one of the first voltage threshold 370 or the second voltage threshold 372 as the configurable voltage threshold 202 responsive to the clock control signal 210. For example, the VTM selector circuit 203 may include a multiplexer that receives the clock gating control signal 210 as a control input. The VTM selector circuit 203 outputs the configurable voltage threshold 202 to the comparison circuit 356.

The digital filter 230 is configured to generate the predicted voltage-response 208. In an example, the digital filter 230 is an infinite impulse response (IIR)-type filter configured to generate estimated voltage values based on estimated current or energy per cycle values indicative of expected current or energy to be consumed by an electronic device, such as the digital filter 230. In a particular implementation, the digital filter 230 includes an IIR-type second order band pass filter.

The comparison circuit 356 is configured to receive the predicted voltage-response 208 and to generate a comparison signal 374 that indicates whether the predicted voltage-response 208 is less than or equal to the configurable voltage threshold 202. In an illustrative example, in response to the predicted voltage-response 208 being less than or equal to the configurable voltage threshold 202, the comparison circuit 356 outputs the comparison signal 374 having a first value (e.g., "1"), and in response to the predicted voltage-response 208 greater than the configurable voltage threshold 202, the comparison circuit 356 outputs the comparison signal 374 having a second value (e.g., "0").

The logic circuit 358 and the flip-flop 209 are configured to generate the clock control signal 210 based on the comparison signal 374. To illustrate, the logic circuit 358 may be configured to generate an output signal based on an inverted version of the comparison signal 374. The output signal is received by the flip-flop 209 and is output as the clock control signal 210.

During operation, in a first clock cycle, the clock control signal 210 may have a "1" value, indicating no clock gating. As a result, in the second clock cycle the first voltage threshold 370 is selected by the VTM selector circuit 203 and compared to the predicted voltage-response 208 in the second clock cycle. In response to the predicted voltage-response 208 being less than or equal to the first voltage threshold 370, the comparison signal 374 has a "1" value, causing the clock control signal 210 to have a "0" value for the next clock cycle (e.g., a third clock cycle) that follows the second clock cycle.

During the third clock cycle, the comparison circuit 356 is configured to compare the predicted voltage-response 208 during the third clock cycle to the second voltage threshold 372 in response to the clock control signal 210 having the "0" value, indicating clock gating during the previous clock cycle (i.e., during the second clock cycle).

The second voltage threshold 372 may have a value set to reduce or eliminate clock gating during consecutive clock cycles. For example, the second voltage threshold 372 may have a different value than the first voltage threshold 370 to prevent the clock control signal 210 from indicating that clock gating is to be applied for that clock cycle. As a result, in such implementations, the VTM selector circuit 203 allows for clock gating only every other clock cycle. The second voltage threshold 372 takes effect through the VTM selector circuit 203 a cycle immediately following the clock cycle where the predicted voltage-response 208 is less than or equal to the first voltage threshold 370 and prevents the processor (e.g., the processor 100) from being gated for two consecutive cycles during voltage-droop mitigation.

The first voltage threshold 370 and the second voltage threshold 372 can be adjusted post-silicon during operation of the processor 100 based on targeted performance and power-savings. In some examples, the first voltage threshold 370 and the second voltage threshold 372 have equal values, which may keep the clock signal 112 gated for two consecutive clock cycles during voltage-droop mitigation. In some implementations, a voltage droop threshold may be set "aggressively" by selecting values of zero for first voltage threshold 370 and the second voltage threshold 372. A greater value (e.g., 127) may be selected to disable the VCG circuit 106 from engaging during any voltage-droop event. The second voltage threshold 372 may take effect, through the VTM selector circuit 203, one cycle after the cycle the VCG circuit 106 engages.

Thus, the second voltage threshold 372 may take effect, through the VTM selector circuit 203, a cycle immediately after voltage-droop mitigation engages following a first cycle that violates a threshold for voltage droop mitigation. The second voltage threshold 372 enables the VCG circuit 106 to clock gate every other cycle, thus preventing consecutive clock gating and limiting performance degradation. In this example, the second voltage threshold 372 prevents the processor 100 from being gated for consecutive cycles during voltage-droop mitigation.

Figure 4:
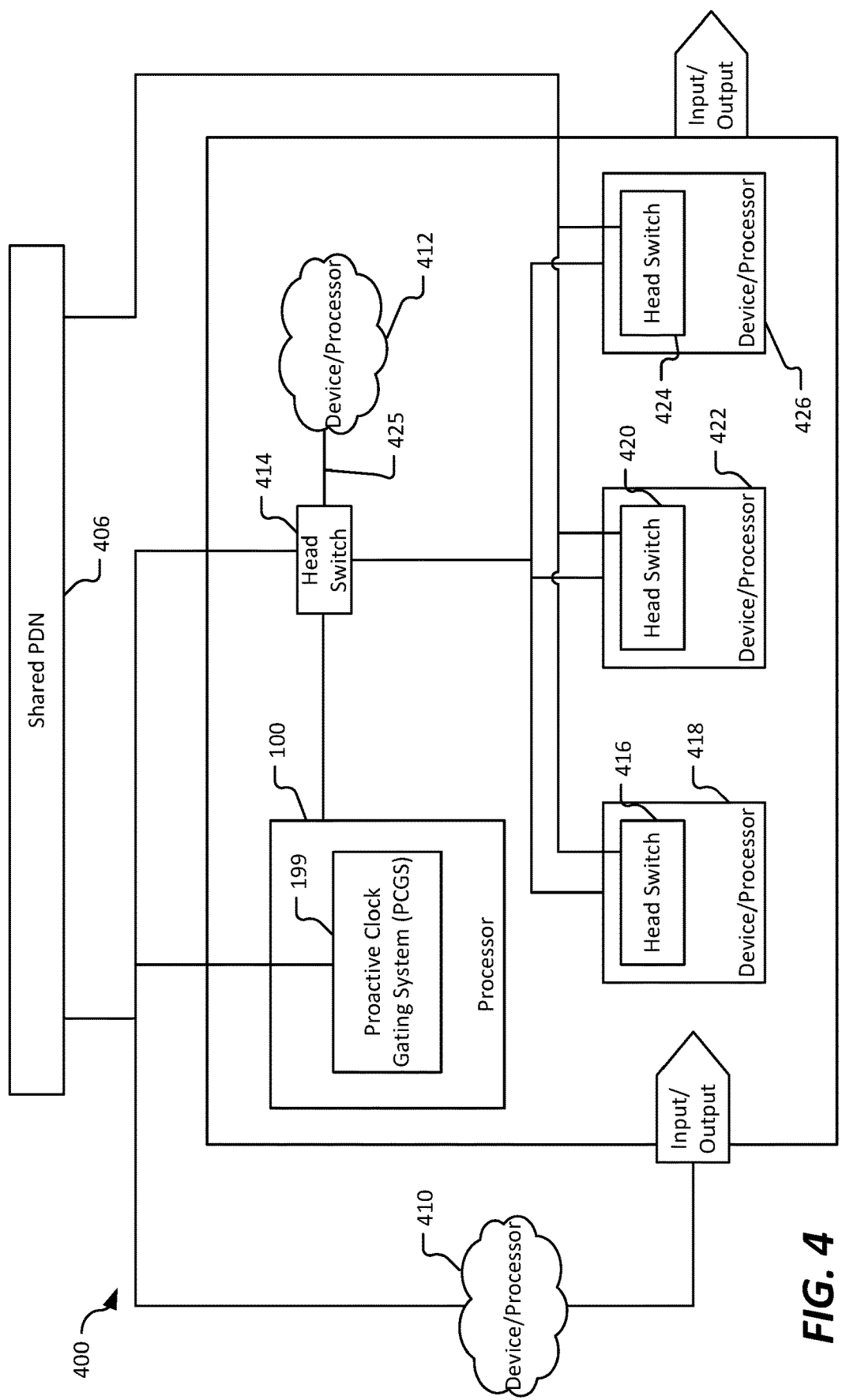
FIG. 4 is a diagram illustrating the processor in FIG. 1A sharing a power delivery network (PDN) voltage supply with other devices and processors.

FIG. 4 depicts an example of a system 400 having a shared power delivery network (PDN) 406. In some examples, the PDN 406 includes a voltage rail that is common to multiple homogeneous or heterogeneous devices or processors, such as the processor 100, a device or processor 410, a device or processor 412, a device or processor 418, a device or processor 422, and a device or processor 426.

The processor 100 includes the PCGS 199 that includes any of the VCG circuit 106, the EFRC 299, the VTM selector circuit 203, the DPE 104, the VPB 110, the PMU 118, the clock circuitry 198, and the global clock gater 216.

The processor 100 is configured to receive a core power supply voltage from the PDN 406. In some examples, the device or processor 410 is coupled to and shorted to the PDN 406. For example, the device or processor 410 may include one or more input/output (I/O) devices coupled to and shorted to one or more I/O terminals of the system 400.

In some examples, the processor 100 is coupled to or includes a head switch 414. The head switch 414 may be configured to generate a supply voltage, such as a power-gated core supply 425, that is based on a parent power supply voltage provided by the PDN 406. Further, the processor 100 can share the same parent supply among multiple processors or devices each having a corresponding head switch configured to receive the power supply voltage from the PDN 406. For example, in FIG. 4, the devices or processors 418, 422, and 426 include head switches 416, 420, and 424, respectively, and share the same PDN 406 as the processor 100. The head switches 416, 420, and 424 are configured to receive the power supply voltage from the PDN 406, and the devices or processors 418, 422, and 426 are configured to receive the power-gated core supply 425. In some examples, the devices or processors 418, 422, and 426 are included in the processor logic 108 and 194 of FIG. 1A.

In a particular example, when a predicted voltage-response of the processor 100 violates the configurable voltage threshold, the PCGS 199 proactively clock-gates the processor 100 when a predicted voltage droop event is about to occur. In some cases, techniques described in this disclosure reduce latency as compared to other devices that use digital circuit monitors such as critical path monitors or analog voltage sensors to trigger droop mitigation. Using a technique in accordance with the disclosure, an aggressor (e.g., the processor 100) with a PCGS 199 may improve voltage noise immunity for other victims (e.g., any of the devices 410, 412, 418, 422, and 426) that may not include a PCGS 199 and that may be connected to the same shared rail as the aggressor. The PCGS 199 may prevent the voltage noise inducer (or "aggressor") from injecting noise by using proactive and predictive clock gating, thus reducing or eliminating voltage noise propagation through either the PDN 406 (which could affect the device 410) or through the power-gated core supply 425 (which could affect the devices 410, 412, 418, 422, 426). In certain conventional devices that do not use a PCGS technique, a victim is unprotected from the voltage noise propagated on the shared rail, which can result in a failed processing operation by the victim due to pipeline execution slow down or due to functional failures caused by voltage noise. In some cases, the failed processing operation increases voltage on the entire shared rail, increasing power to devices supplied by the same voltage rail and causing the devices to consume more power via the shared rail. If the aggressor uses a conventional reactive voltage droop mitigation technique, then voltage reduction may be associated with latency. In this example, the reaction time of a conventional technique may permit voltage noise to propagate to a victim device prior to voltage droop mitigation taking effect.

The system 400 includes a primary device (e.g., the processor 100) and at least one other device (e.g., any of the devices 410, 412, 418, 422, 426) configured to operate with or without monitoring a voltage level of the supply voltage of the shared PDN 406 (or a voltage level of the power-gated core supply 425). For example, in some implementations, by using the PCGS 199, the processor 100 and the devices 410, 412, 418, 422, 426 are not required to monitor voltage level of the supply voltage of the shared PDN 406 (or a voltage level of the power-gated core supply 425). In some examples, the primary device and the at least one other device are configured to share a same power distribution network voltage supply, such as a voltage supply of the shared PDN 406. In some examples, one or both of the primary device and the at least one other device are each coupled to a respective dedicated and private power distribution network having an independent voltage supply. Thus, certain circuitry associated with voltage level monitoring can be omitted, increasing power savings and circuit area available for other device components.

Figure 5A:
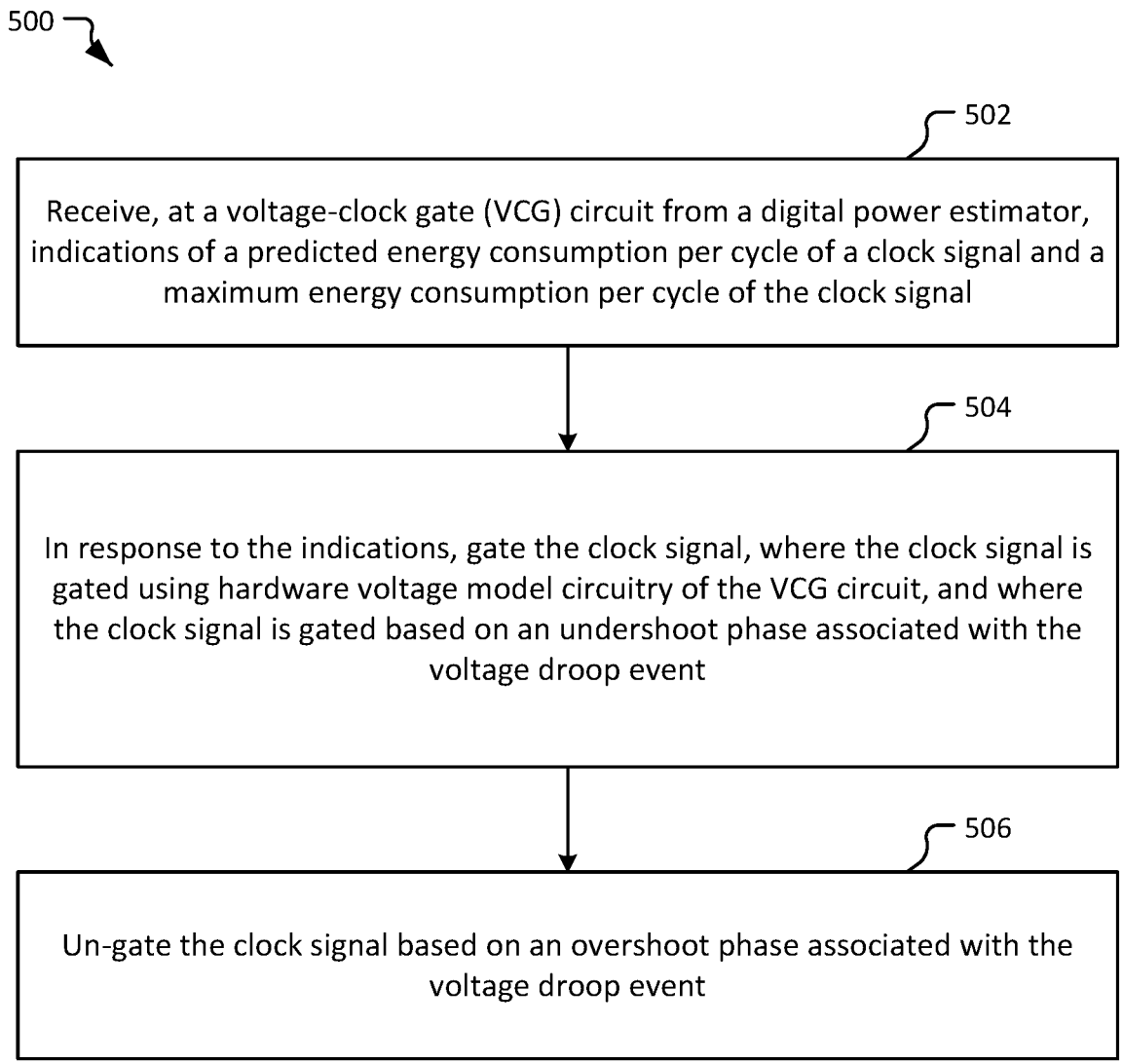
FIG. 5A is a flow chart of an example of a method of operation of the PCGS of FIG. 1A.

Referring to FIG. 5A, a particular illustrative example of a method is depicted and generally designated 500. In some examples, operations of the method 500 are performed by the processor 100.

The method 500 includes receiving, at a voltage-clock gate (VCG) circuit from a digital power estimator, indications of a predicted energy consumption per cycle of a clock signal and a maximum energy consumption per cycle of the clock signal, at 502. For example, the DPE 104 may be configured to generate an indication of the predicted energy 122 per cycle of the clock signal 112 and an indication of the maximum energy 124 per cycle of the clock signal 112, and the VCG circuit 106 may be configured to receive the indications from the DPE 104. In some examples, the DPE 104 is configured to provide the indications to the VCG circuit 106 multiple cycles of the clock signal 112 prior to occurrence of the voltage droop event to enable the VCG circuit 106 to gate the clock signal 112 during a clock cycle associated with the undershoot phase.

The method 500 further includes, in response to the indications, gating the clock signal, at 504. The clock signal is gated prior to occurrence of a voltage droop event and using hardware voltage model circuitry of the VCG circuit, and the clock signal is gated based on an undershoot phase associated with the voltage droop event. To illustrate, the VCG circuit 106 may be configured to gate the clock signal 112 so that the clock signal 112 is gated while the predicted voltage-response 208 is less than or equal to the configurable voltage threshold 202 (e.g., while a voltage droop event is in an undershoot phase). The VCG circuit 106 includes hardware voltage model circuitry, such as any of the digital filter 230, the VTM selector circuit 203, and the comparison circuit 356, as illustrative examples.

The method 500 further includes un-gating the clock signal based on an overshoot phase associated with the voltage droop event, at 506. To illustrate, the VCG circuit 106 may be configured to un-gate the clock signal 112 so that the clock signal 112 is un-gated while the predicted voltage-response 208 is greater than the configurable voltage threshold 202 (e.g., while a voltage droop event is in an overshoot phase).

Figure 5B:
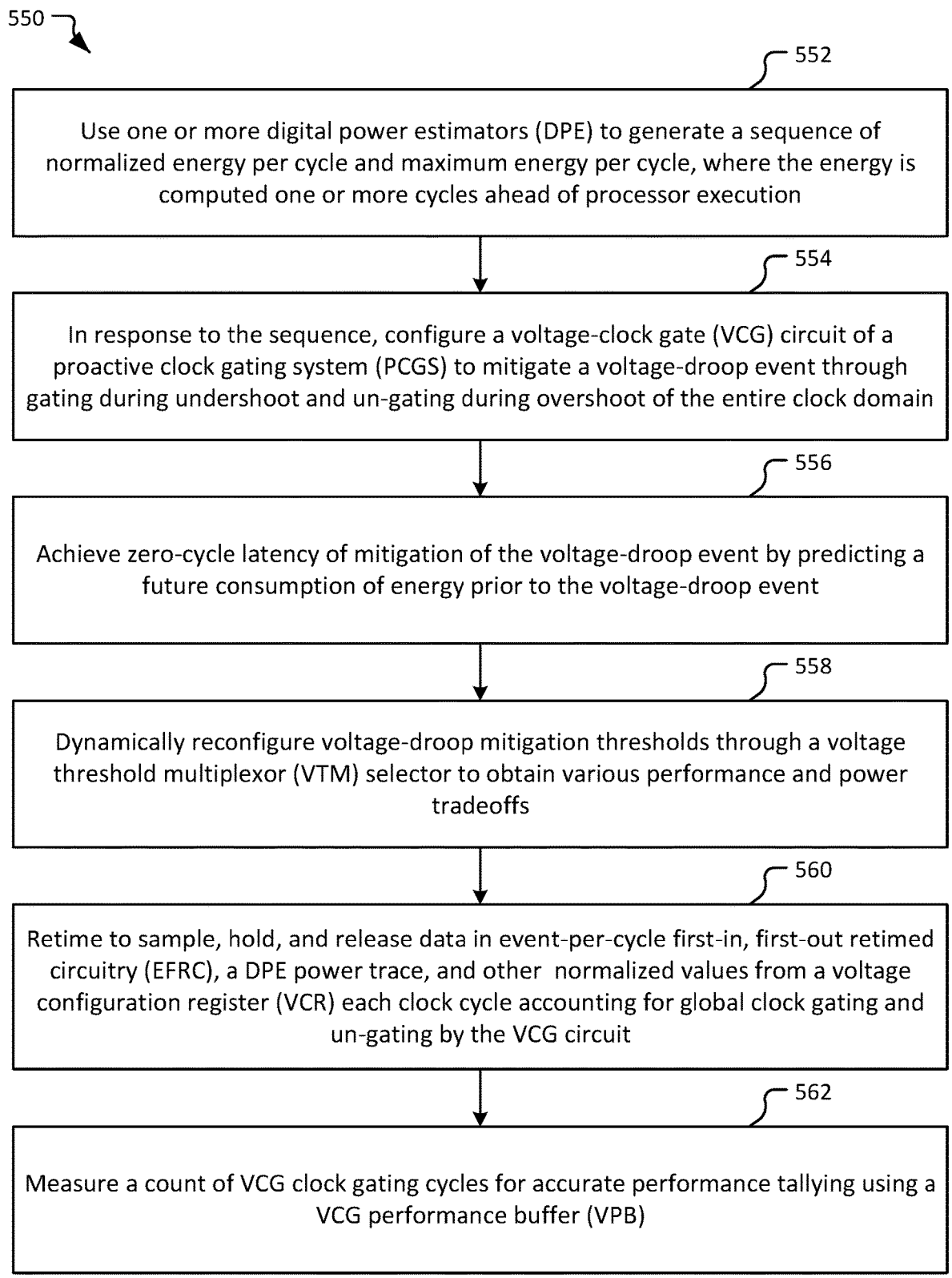
FIG. 5B is a flow chart of an example of a method of operation of the PCGS of FIG. 1A.

Referring to FIG. 5B, a particular illustrative example of a method is depicted and generally designated 550. In some examples, operations of the method 550 are performed by the processor 100.

The method 550 includes using one or more digital power estimators (DPE) to generate a sequence of normalized energy per cycle and maximum energy per cycle, where the energy is computed one or more cycles ahead of processor execution, at 552. The method 550 further includes, in response to the sequence, configuring a voltage-clock gate (VCG) circuit of a proactive clock gating system (PCGS) to mitigate a voltage-droop event through gating during undershoot and un-gating during overshoot of the entire clock domain, at 554.

The method 550 further includes achieving zero-cycle latency of mitigation of the voltage-droop event by predicting a future consumption of energy prior to the voltage-droop event, at 556. The method 550 further includes dynamically reconfiguring voltage-droop mitigation thresholds through a voltage threshold multiplexer (VTM) selector to obtain various performance and power tradeoffs, at 558.

The method 550 further includes retiming to sample, hold, and release data in event-per-cycle first-in, first-out retimed circuitry (EFRC), a DPE power trace, and other normalized values from a voltage configuration register (VCR) each clock cycle accounting for global clock gating and un-gating by the VCG circuit, at 560. The method 550 further includes measuring a count of VCG clock gating cycles for accurate performance tallying using a VCG performance buffer (VPB), at 562.

Figure 6:
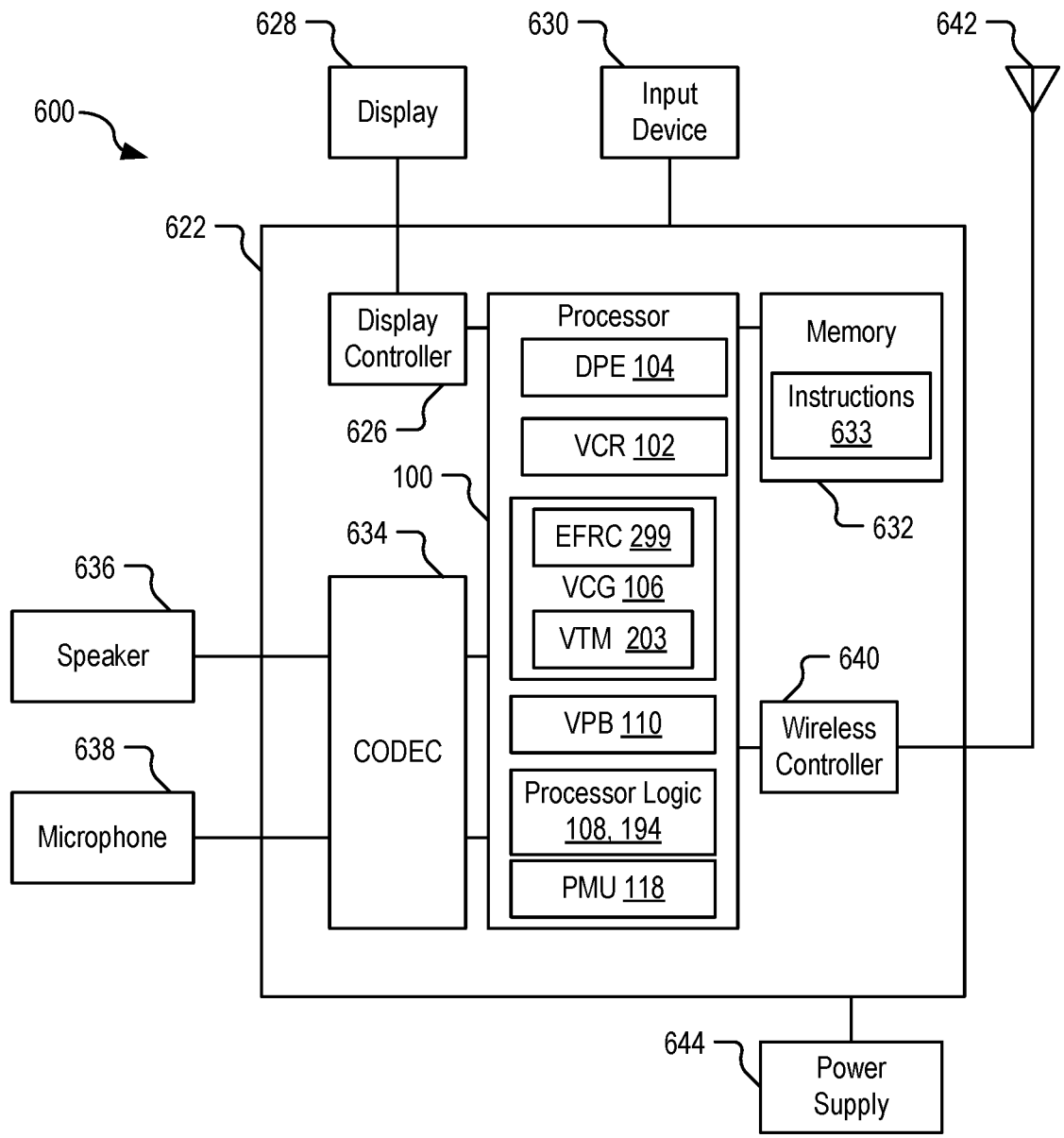
FIG. 6 is a block diagram of an electronic device including the processor of FIG. 1A.

Referring to FIG. 6, a block diagram of a particular illustrative example of an electronic device is depicted and generally designated 600. The electronic device 600 may include a system-in-package or system-on-chip device and may include the processor 100. In some examples, a voltage supply for the electronic device 600 and the processor 100 may be supplied from a power supply 644. The processor 100 may include a proactive clock gating system (PCGS) including the VCG circuit 106. The VCG circuit 106 may be coupled to the DPE 104 and to the VCR 102.

The PCGS may be configured to compute an estimated voltage occurrence of a voltage droop event. The VCG circuit 106 includes the EFRC 299 to retime and pipeline stage control and data signals each clock cycle prior to internal computation and decision making by the VCG circuit 106.

The VCG circuit 106 may be configured to generate clock enables to gate and un-gate clock signals provided to the processor logic 108, 194 during voltage droop events in the processor 100. The VTM selector circuit 203 may dynamically reconfigure the VCG circuit 106 to provide different programmable options of voltage thresholds that determine clock gating by the VCG circuit 106.

The PCGS may be configured to detect voltage droops in the voltage supply and provide a gated clock signal. The performance loss due to voltage droop mitigation may be accurately measured using the VPB 110, which may provide such information to the PMU 118. Various details of the PCGS have been omitted from the example depicted in FIG. 6, but aspects of the PCGS may be implemented using one or more aspects described above. Although not shown, one or more other processors 100 may share the same power supply and may also be included in the electronic device 600.

Depending on the particular implementation, the electronic device 600 may correspond to a mobile device (e.g., a cellular phone), a computer (e.g., a server, a laptop computer, a tablet computer, or a desktop computer), an access point, a base station, a wearable electronic device (e.g., a personal camera, a head-mounted display, or a watch), a vehicle control system or console, an autonomous vehicle (e.g., a robotic car or a drone), a home appliance, a set top box, an entertainment device, a navigation device, a personal digital assistant (PDA), a television, a monitor, a tuner, a radio (e.g., a satellite radio), a music player (e.g., a digital music player or a portable music player), a video player (e.g., a digital video player, such as a digital video disc (DVD) player or a portable digital video player), a robot, a healthcare device, an Internet of Things (IoT) device, another electronic device, or a combination thereof.

The electronic device 600 may further include one or more memories, such as a memory 632. The memory 632 may be coupled to the processor 100, to another memory, or to both. The memory 632 may be configured to store instructions 633 that are executable by the processor 100, by another processor, or both. The memory 632 may include random access memory (RAM), magnetoresistive random access memory (MRAM), flash memory, read-only memory (ROM), programmable read-only memory (PROM), erasable programmable read-only memory (EPROM), electrically erasable programmable read-only memory (EEPROM), one or more registers, a hard disk, a removable disk, a compact disc read-only memory (CD-ROM), another memory device, or a combination thereof.

FIG. 6 also shows a display controller 626 that is coupled to the processor 100 and to a display 628. A coder/decoder (CODEC) 634 can also be coupled to the processor 100. A speaker 636 and a microphone 638 can be coupled to the CODEC 634.

FIG. 6 also indicates that a wireless controller 640 can be coupled to the processor 100 and to an antenna 642. In a particular example, the processor 100, the display controller 626, the memory 632, the CODEC 634, and the wireless controller 640 are included in a system-in-package or system-on-chip device 622. In a particular example, an input device 630 and the power supply 644 are coupled to the system-on-chip device 622. Moreover, in a particular example, as illustrated in FIG. 6, the display 628, the input device 630, the speaker 636, the microphone 638, the antenna 642, and the power supply 644 are external to the system-on-chip device 622. However, each of the display 628, the input device 630, the speaker 636, the microphone 638, the antenna 642, and the power supply 644 can be coupled to a component of the system-on-chip device 622, such as to an interface or to a controller.

In conjunction with the described embodiments, a computer-readable medium (e.g., the memory 632) stores instructions (e.g., the instructions 633) executable by a processor (e.g., the processor 100) to initiate, perform, or control operations. The operations include receiving, at a voltage-clock gate (VCG) circuit (e.g., the VCG circuit 106) from a digital power estimator (e.g., the DPE 104), indications of a predicted energy consumption (e.g., the predicted energy 122) per cycle of a clock signal (e.g., the clock signal 112) and a maximum energy consumption (e.g., the maximum energy 124) per cycle of the clock signal. In some examples, the indications are received from a VCG configuration register (e.g., the VCR 102) and include PDN characteristics, such as a PDN center frequency and a PDN bandwidth. The operations further include, in response to the indications, gating the clock signal. The clock signal is gated prior to occurrence of a voltage droop event and using hardware voltage model circuitry of the VCG circuit, and the clock signal is gated based on an undershoot phase associated with the voltage droop event. The operations further include un-gating the clock signal based on an overshoot phase associated with the voltage droop event.

In conjunction with the described embodiments, an apparatus includes means (e.g., the DPE 104) for generating indications of a predicted energy consumption (e.g., the predicted energy 122) per cycle of a clock signal (e.g., the clock signal 112) and a maximum energy consumption (e.g., the maximum energy 124) per cycle of the clock signal. The apparatus further includes means (e.g., the VCG circuit 106) for gating and for un-gating the clock signal based on the indications prior to occurrence of a voltage droop event and using hardware voltage model circuitry. The means for gating and un-gating is configured to gate the clock signal based on an undershoot phase associated with the voltage droop event and to un-gate the clock signal based on an overshoot phase associated with the voltage droop event. In some implementations, the apparatus further includes means (e.g., the processor fetch, issue, control, memory access, and execution pipeline 270) for executing instructions coupled to the means for generating and the means for gating and un-gating.

The foregoing disclosed devices and functionalities may be designed and configured into computer files (e.g., RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips are then employed in devices described above.

Those of skill would further appreciate that the various illustrative logical blocks, configurations, modules, circuits, and algorithm steps described in connection with the embodiments disclosed herein may be implemented as electronic hardware, computer software, or combinations of both. Various illustrative components, blocks, configurations, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of storage medium known in the art. An exemplary non-transitory (e.g. tangible) storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A clock gating system (CGS) comprising:
a digital power estimator configured to generate indications of a predicted energy consumption per cycle of a clock signal and a maximum energy consumption per cycle of the clock signal; and
a voltage-clock gate (VCG) circuit coupled to the digital power estimator and configured to gate and un-gate the clock signal based on the indications prior to occurrence of a voltage droop event and using hardware voltage model circuitry of the VCG circuit,
wherein the VCG circuit is further configured to gate the clock signal based on an undershoot phase associated with the voltage droop event and to un-gate the clock signal based on an overshoot phase associated with the voltage droop event.

2. The CGS of claim 1, wherein the VCG circuit is configured to gate the clock signal to reduce or eliminate voltage droop in a supply voltage, and further comprising a primary device and at least one other device configured to operate with or without monitoring a voltage level of the supply voltage, wherein the primary device and at least one other device are configured to share a same power distribution network voltage supply or are each coupled to a respective dedicated and private power distribution network having an independent voltage supply.

3. The CGS of claim 2, further comprising a VCG configuration register (VCR) coupled to the VCG circuit and configured to store indications of characteristics of a power delivery network (PDN) that is configured to generate the supply voltage.

4. The CGS of claim 3, wherein the VCR is further configured to store indications of a center frequency of the PDN and a bandwidth of the PDN.

5. The CGS of claim 3, wherein the VCR is further configured to store the indications of the predicted energy consumption per cycle of the clock signal and the maximum energy consumption per cycle of the clock signal.

6. The CGS of claim 1, wherein the VCG circuit includes event-per-cycle first-in, first-out (FIFO) retimed circuitry (EFRC) configured to sample, hold, and release predicted energy values during a clock gating and un-gating operation performed by the VCG circuit.

7. The CGS of claim 1, wherein the hardware voltage model circuitry includes a voltage threshold multiplexer (VTM) selector circuit configured to select a configurable voltage threshold for clock gating by the VCG circuit from among a first voltage threshold and a second voltage threshold.

8. The CGS of claim 7, further comprising a VCG configuration register (VCR) coupled to the VCG circuit and configured to store indications of the first voltage threshold and the second voltage threshold.

9. The CGS of claim 7, wherein the hardware voltage model circuitry includes a digital filter configured to determine a predicted voltage-response based on the indications of the predicted energy consumption per cycle of the clock signal and the maximum energy consumption per cycle of the clock signal.

10. The CGS of claim 9, wherein the hardware voltage model circuitry further includes a comparison circuit configured to initiate clock-gating of a first cycle of the clock signal in response to a determination that the predicted voltage-response exceeds the configurable voltage threshold.

11. The CGS of claim 10, wherein the VCG circuit is further configured to adjust the configurable voltage threshold, in response to gating the first cycle of the clock signal, from the first voltage threshold to the second voltage threshold for a second cycle of the clock signal following the first cycle.

12. The CGS of claim 1, wherein the digital power estimator is further configured to provide the indications to the VCG circuit multiple cycles of the clock signal prior to occurrence of the voltage droop event to enable the VCG circuit to gate the clock signal during a clock cycle associated with the undershoot phase.

13. The CGS of claim 1, wherein the digital power estimator comprises one or more weighted event indication generators (WEIGs) configured to determine the predicted energy consumption per cycle and the maximum energy consumption per cycle.

14. The CGS of claim 13, wherein at least one WEIG of the one or more WEIGs comprises:
a first multiplication circuit configured to multiply an event count per cycle of the clock signal by a set of energy weights to determine a first set of weighted event indications; and
a second multiplication circuit configured to multiply a maximum event count per cycle of the clock signal by the set of energy weights to determine a second set of weighted event indications.

15. The CGS of claim 14, wherein the digital power estimator further comprises a first addition circuit coupled to each of the one or more WEIGs and configured to determine the predicted energy consumption per cycle based on first sets of weighted event indications from the one or more WEIGs.

16. The CGS of claim 15, wherein the digital power estimator further comprises a second addition circuit coupled to each of the one or more WEIGs and configured to determine the maximum energy consumption per cycle based on second sets of weighted event indications from the one or more WEIGs.

17. The CGS of claim 1, further comprising a VCG performance buffer (VPB) coupled to the VCG circuit and configured to generate an output signal indicating an accumulated count of gated cycles of the clock signal.

18. The CGS of claim 17, further comprising a performance monitoring unit (PMU) coupled to the VPB and configured to track performance of a processor based on the accumulated count of gated cycles.

19. The CGS of claim 18, wherein the PMU is configured to track the performance of the processor during gating of the clock signal by the VCG circuit.

20. A method comprising:
receiving, at a voltage-clock gate (VCG) circuit from a digital power estimator, indications of a predicted energy consumption per cycle of a clock signal and a maximum energy consumption per cycle of the clock signal;
in response to the indications, gating the clock signal, wherein the clock signal is gated prior to occurrence of a voltage droop event and using hardware voltage model circuitry of the VCG circuit, and wherein the clock signal is gated based on an undershoot phase associated with the voltage droop event; and
un-gating the clock signal based on an overshoot phase associated with the voltage droop event.

21. The method of claim 20, further comprising selecting, by a voltage threshold multiplexer (VTM) selector circuit of the hardware voltage model circuitry, a configurable voltage threshold for clock gating by the VCG circuit from among a first voltage threshold and a second voltage threshold.

22. The method of claim 21, further comprising accessing, from a VCG configuration register (VCR), indications of the first voltage threshold and the second voltage threshold.

23. The method of claim 22, further comprising determining, by a digital filter of the hardware voltage model circuitry, a predicted voltage-response based on the indications.

24. The method of claim 23, further comprising initiating, by a comparison circuit of the hardware voltage model circuitry, clock-gating of a first cycle of the clock signal in response to a determination that the predicted voltage-response exceeds the configurable voltage threshold.

25. The method of claim 24, further comprising, in response to gating the first cycle of the clock signal, adjusting the configurable voltage threshold from the first voltage threshold to the second voltage threshold for a second cycle of the clock signal following the first cycle.

26. A non-transitory computer-readable medium storing instructions executable by a processor to initiate, perform, or control operations, the operations comprising:
receiving, at a voltage-clock gate (VCG) circuit from a digital power estimator, indications of a predicted energy consumption per cycle of a clock signal and a maximum energy consumption per cycle of the clock signal;
in response to the indications, gating the clock signal, wherein the clock signal is gated prior to occurrence of a voltage droop event and using hardware voltage model circuitry of the VCG circuit, and wherein the clock signal is gated based on an undershoot phase associated with the voltage droop event; and un-gating the clock signal based on an overshoot phase associated with the voltage droop event.

27. The non-transitory computer-readable medium of claim 26, further comprising selecting, by a voltage threshold multiplexer (VTM) selector circuit of the hardware voltage model circuitry, a configurable voltage threshold for clock gating by the VCG circuit from among a first voltage threshold and a second voltage threshold.

28. The non-transitory computer-readable medium of claim 27, further comprising accessing, from a VCG configuration register (VCR), indications of the first voltage threshold and the second voltage threshold.

29. An apparatus comprising:
   means for generating indications of a predicted energy consumption per cycle of a clock signal and a maximum energy consumption per cycle of the clock signal; and
   means for gating and for un-gating the clock signal based on the indications prior to occurrence of a voltage droop event and using hardware voltage model circuitry,
   wherein the means for gating and un-gating is configured to gate the clock signal based on an undershoot phase associated with the voltage droop event and to un-gate the clock signal based on an overshoot phase associated with the voltage droop event.

30. The apparatus of claim 29, further comprising means for executing instructions coupled to the means for generating and the means for gating and un-gating.

* * * * *